(12) United States Patent
Kusamitsu

(10) Patent No.: US 8,014,162 B2
(45) Date of Patent: Sep. 6, 2011

(54) FLEXIBLE PRINTED CIRCUIT BOARD

(75) Inventor: Hideki Kusamitsu, Kawasaki (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 976 days.

(21) Appl. No.: 11/905,913

(22) Filed: Oct. 5, 2007

(65) Prior Publication Data

US 2008/0083559 A1 Apr. 10, 2008

(30) Foreign Application Priority Data

Oct. 6, 2006 (JP) ................................. 2006-275324

(51) Int. Cl.
  H05K 7/02 (2006.01)
  H05K 7/06 (2006.01)
  H05K 7/08 (2006.01)
  H05K 7/10 (2006.01)

(52) U.S. Cl. ........ 361/760; 361/749; 361/750; 174/254; 174/255; 174/358

(58) Field of Classification Search .......... 361/749–750; 174/254–258

See application file for complete search history.

(56) References Cited

U.S. PATENT DOCUMENTS

| | | | |
|---|---|---|---|
| 6,249,076 B1 * | 6/2001 | Madden et al. | 310/363 |
| 6,278,345 B1 | 8/2001 | Dai | |
| 6,749,556 B2 * | 6/2004 | Banik | 600/30 |

FOREIGN PATENT DOCUMENTS

| | | |
|---|---|---|
| JP | 62-55992 | 3/1987 |
| JP | 07-022741 | 1/1995 |
| JP | 09-134623 | 5/1997 |
| JP | 2000-269612 | 9/2000 |
| JP | 2002-033556 | 1/2002 |
| JP | 2006-24824 | 1/2006 |
| JP | 2006-93018 | 4/2006 |
| JP | 2006-196232 | 7/2006 |

OTHER PUBLICATIONS

Search Report dated Oct. 24, 2008 in corresponding Singapore Patent Application No. 200716686-1.
Office Action dated Aug. 31, 2009 in corresponding Korean Patent Application No. 10-2007-0100261.
Office Action dated Jan. 9, 2009 in corresponding Japanese Patent Application No. 2006-275324.
Office Action dated May 30, 2008 issued in corresponding Japanese Application No. 2006-275324.

* cited by examiner

Primary Examiner — Tuan T Dinh
(74) Attorney, Agent, or Firm — Finnegan, Henderson, Farabow, Garrett & Dunner, LLP

(57) ABSTRACT

A flexible printed circuit board wherein the insulative substrate 34 having a plurality of conductive layers 36b covered with a protective layer 38 is encircled by a mesh-cloth member 32.

6 Claims, 11 Drawing Sheets

FLEXIBLE PRINTED CIRCUIT BOARD

This application claims the benefit of Japanese Patent Application No. 2006-275324, filed Oct. 6, 2006, which is hereby incorporated by reference herein in its entirety.

FIELD OF THE INVENTION

The present invention relates to a flexible printed circuit board for the mutual electrical connection of electrical components.

DESCRIPTION OF THE RELATED ART

Regarding the mutual electrical connection of electrical components, a flexible printed circuit board (FPC) is in practical use as disclosed in Japanese Patent Laid-Open NO. 2000-269612. This flexible printed circuit board 2 has a structure wherein a plurality of conductive layers 8a, 8b and 8c covered with a protective layer 10 are formed on one surface of an insulative substrate 6 e.g. as shown in FIG. 11A.

The insulative substrate 6 is molded with glass-epoxy resin, for example. Also, the conductive layers 8a, 8b and 8c are formed from e.g. a layer of a copper alloy. The protective layer 10 is formed out of a heat-curable resist layer or a polyimide film, for example.

If the two conductive layers 8b are signal lines, the ground line conductive layers 8a and 8c are formed adjacent to opposite sides of the respective conductive layers 8b at a predetermined interval for the purpose of reducing the crosstalk in the signal lines.

A ground layer 4 (a shield layer) is formed all over the other surface of the insulative substrate 6 opposite to the above-mentioned surface. The ground layer 4 is connected to the above-mentioned conductive layers 8a and 8c through via holes 6a and 6b. The ground layer 4 is provided for avoiding the deterioration of transmission characteristic (disturbance of the impedance characteristic) caused by the electric interference with a metallic housing when the flexible printed circuit board is disposed in the metallic housing of an electronic equipment and differential signals at a relatively high frequency band are transmitted through the conductive layer 8b.

Further, there may be cases wherein the employment of the structure forming via holes 6a and 6b described above is difficult in the flexible printed circuit board due to the problem in the manufacturing technique thereof. In such cases, instead of the ground layer 4, the flexible printed circuit board 12 is further provided with a dielectric layer 24 having a metallic covering layer 26 on the outer surface and another dielectric layer 16 having a metallic covering layer 14 on the outer surface as shown in FIG. 11B.

In FIG. 11B, the flexible printed circuit board has a structure in that a plurality of conductive layers 20a, 20b and 20c covered with a protective layer 22 are formed on one surface of an insulative substrate 18. If the two conductive layers 20b are signal lines, the conductive layers 20a and 20b are formed adjacent to opposite sides of the respective conductive layers 20b at a predetermined interval for the purpose of reducing the crosstalk in the signal lines. On the lower surface of the insulative substrate 18, a dielectric layer 16 having a metallic covering layer 14 is layered on the lower surface of the insulative substrate 18. On the other hand, on the upper surface of the protective layer 22 opposed to the insulative substrate 18, a dielectric layer 24 having a metallic covering layer 26 on the outer surface is layered. In this regard, the metallic covering layers 14 and 16 are connected via a plurality of through-holes (not shown) to equalize the potentials thereof each other.

By such a structure that the metallic covering layers 14 and 26 encircle the respective conductive layers 20b via the dielectric layers 16 and 24, it is possible to avoid the deterioration of the transmission characteristic (the disturbance of the impedance characteristic) caused by the electric interference with the metallic housing.

SUMMARY OF THE INVENTION

As shown in FIG. 11A, when the ground layer 4 is formed, the impedance matching is necessary for assuring the flexibility of the flexible printed circuit board under the condition wherein the thickness of the insulative substrate 6 is relatively thin. For the impedance matching, however, it is required to make a width of the respective dielectric layer 8b (a wire diameter of the signal line) to be smaller, resulting in the increase in conductive resistance. This increases the transmission loss, and there may be a risk in that the transmission of signals at a high frequency band is difficult when a length of the flexible printed circuit board is relatively longer.

As shown in FIG. 11B, if the respective dielectric layers 20b are enclosed via the dielectric layers 16 and 24, the effective relative permittivity and the dielectric loss coming from a dielectric increase. Further, as described above, since the metallic covering layers 14 and 26 must be connected to each other via a plurality of through-holes not shown to equalize the potentials thereof to each other, the number of processes for producing the flexible printed circuit board increase to raise the production cost.

Accordingly, as mentioned above, there is a risk in that the transmission loss increases and the transmission of signals at a high frequency band becomes difficult.

By taking such problems into consideration, an object of the present invention is to provide, at a low production cost, a flexible printed circuit board for electrically connecting electric equipments to each other, without increasing a loss of signal transmission even if a length of the flexible printed circuit board is relatively long.

To achieve the above-mentioned object, a flexible printed circuit board according to the present invention comprises an insulative substrate having a plurality of ground conductive layers and a signal-transmission conductive layer formed between the ground conductive layers, and a reticulate covering member formed of porous dielectric for covering the insulative substrate.

Also, a flexible printed circuit board according to the present invention, comprises an insulative substrate having a plurality of ground conductive layers and a signal-transmission conductive layer formed between the ground conductive layers, and a reticulate covering member formed of porous dielectric for covering the insulative substrate, and having a conductive cover layer on the outer circumference thereof; the conductive cover layer being electrically connected to an end of the ground conductive layer.

As apparent from the above-mentioned explanation, according to the flexible printed circuit board of the present invention, since the reticulate covering member formed of porous dielectric covers the insulative substrate to reduce the electrical interference, there is no risk of increase in transmission loss even if a length of the flexible printed circuit board is relatively long. In addition, the production cost thereof is not expensive.

Further features of the present invention will become apparent from the following description of exemplary embodiments (with reference to the attached drawings).

DESCRIPTION OF THE EMBODIMENTS

Figure 1:
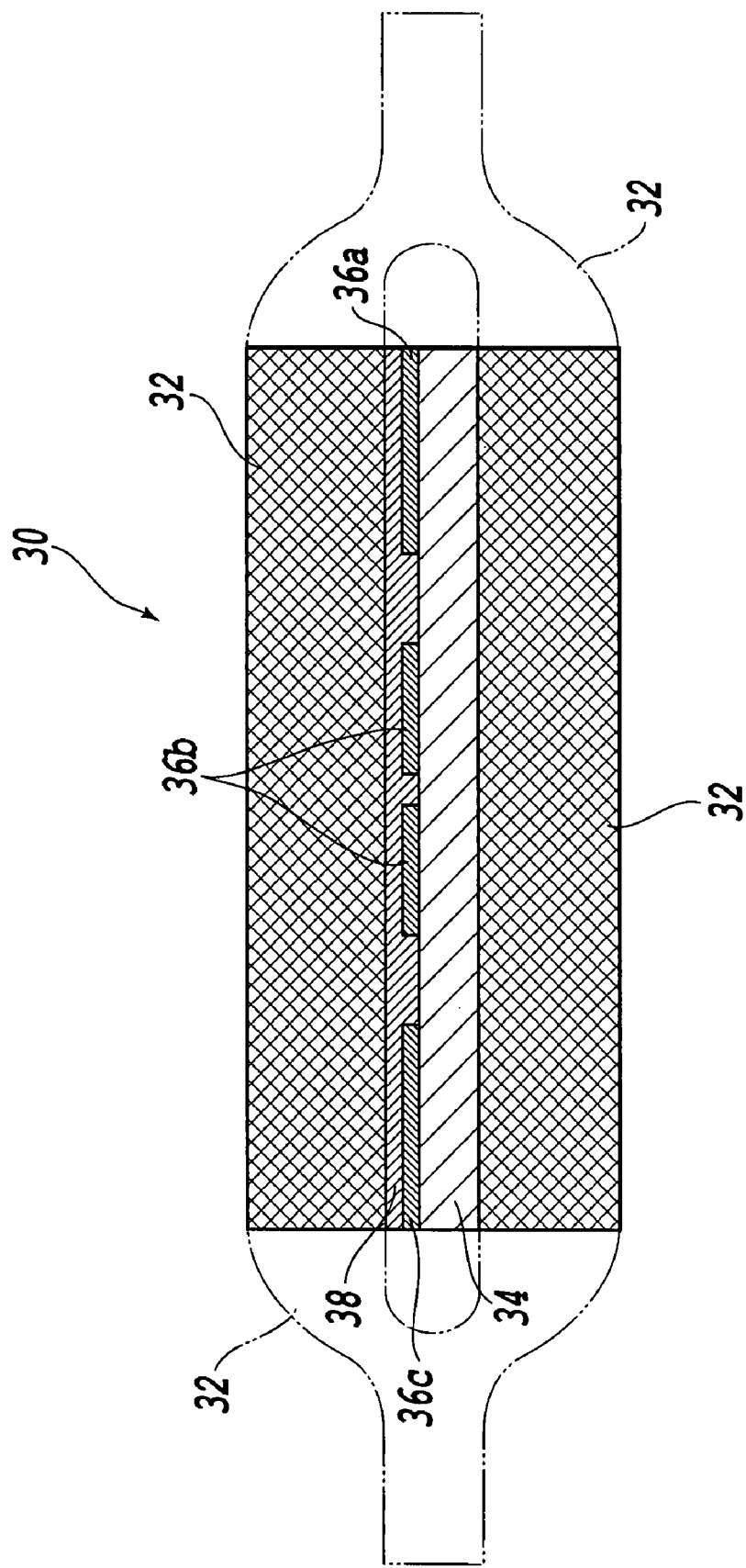
FIG. 1 is a partial cross-sectional view illustrating a main part of a first embodiment of a flexible printed circuit board according to the present invention.
Figure 2:
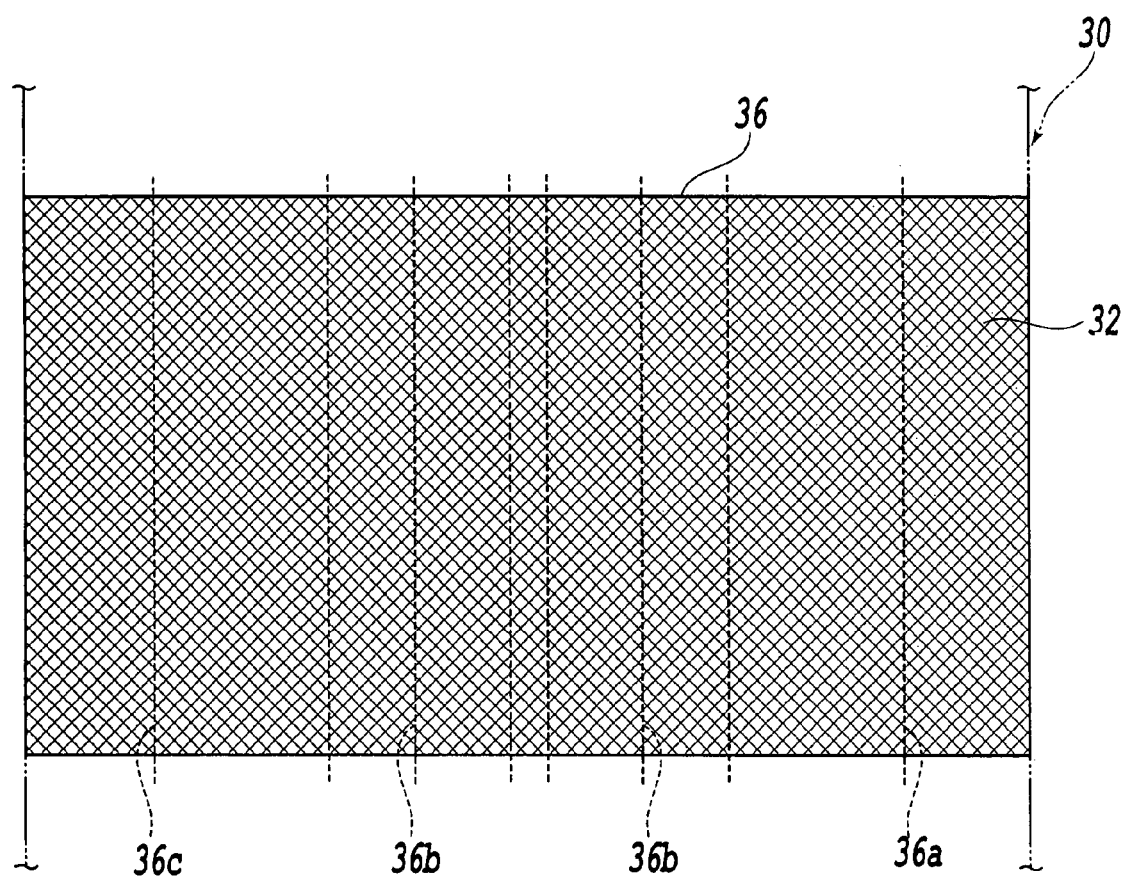
FIG. 2 is a plan view illustrating part of the embodiment shown in FIG. 1.

FIGS. 1 and 2 illustrate a main part of a first embodiment of a flexible printed circuit board according to the present invention.

In FIG. 1, the flexible printed circuit board 30 includes an insulative substrate 34 having a plurality of conductive layers 36a, 36b and 36c covered with a protective layer 38 on one surface, and a mesh-cloth member 32 which is a reticulate covering member encircling all of the protective layer 38 and the insulative substrate 34. Note in FIGS. 1 and 2, a part of the flexible printed circuit board 30 having a predetermined length is illustrated in enlarged dimension.

The insulative substrate 34 is molded, for example, with glass-epoxy resin, liquid crystal polymer or others to be approximately 50 μm thick. On the other hand, the plurality of conductive layers 36a, 36b and 36c are formed of copper alloy by a known pattern-forming technique. Two conductive layers 36b extend generally parallel to each other vertical to a paper surface and form signal lines. The conductive layers 36a and 36c used as ground lines are formed adjacent to the respective conductive layers 36b on opposite sides thereof apart at an interval for reducing the crosstalk in the signal lines. A width of the respective conductive layer 36b is set to, for example, approximately 350 μm. Differential signals at a communication speed of in a range from 2.5 to 10 Gbps, for example, are fed to the pair of two conductive layers 36b. The protective layer 38 is formed, for example, from heat-curable resist, photoresist or polyimide film or the like.

The mesh-cloth member 32 is formed, for example, of derivatives of tetrafluoroethylene, polyethylene, nylon or others. The derivatives are not limited to the above-mentioned ones but may be those having a relative dielectric constant in a range between or equal to 1.01 and 4. Here, gas such as air (having the relative dielectric constant of 1.00059) is not included as the dielectric. If the relative dielectric constant exceeds 4, there is a possibility in that electrical characteristics may be deteriorated. Therefore, preferably the relative dielectric constant is at or below 4.

The mesh-cloth member 32 encircles whole of the protective layer 38 and the insulative substrate 34 at a uniform thickness. The thickness of the mesh-cloth member 32 is, for example, in a range from 0.3 to 1 mm. A voidage (porosity) of the mesh-cloth member 32 is, for example, 50% or more. The inner circumference of the mesh-cloth member 32 is in close contact with the outer circumference of the protective layer 38 and the insulative substrate 34 without using adhesive or other.

The mesh-cloth member 32 is structured, for example, by arranging two mesh-cloth pieces having a predetermined length opposite to each other while interposing the protective layer 38 and the insulative substrate 34 between them, and heat sealing lapped ends thereof extending along the signal lines as described above.

Figure 3A:
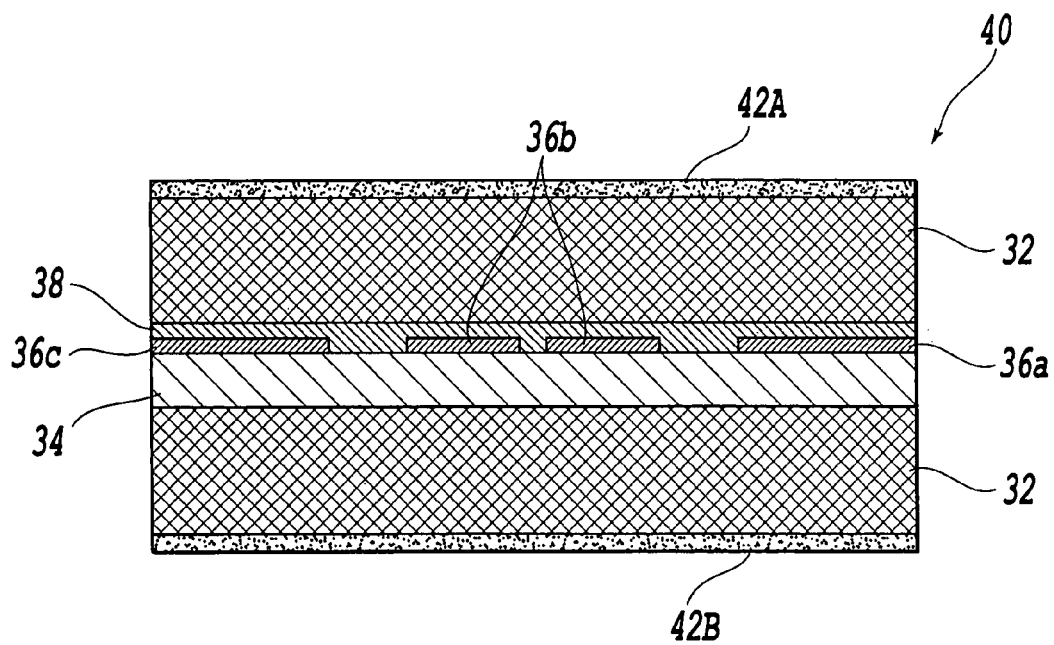
FIG. 3A is a partial cross-sectional view illustrating a main part of a second embodiment of a flexible printed circuit board according to the present invention.
Figure 3B:
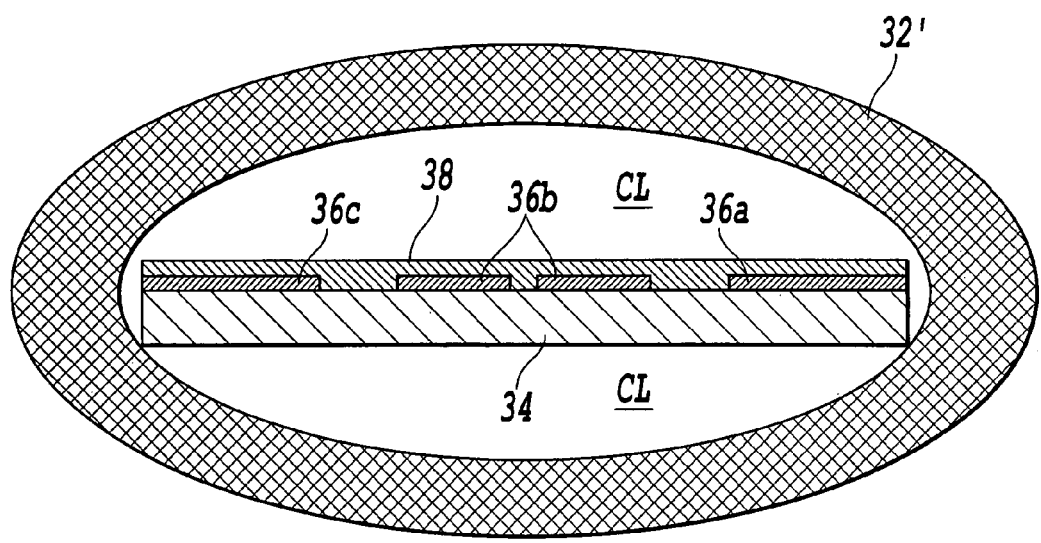
FIG. 3B illustrates a modification of the flexible printed circuit board according to the first embodiment of the present invention.

In this regard, while the mesh-cloth member 32 is formed by heat sealing the lapped ends thereof, this is not limitative, but the mesh-cloth member may be a one-pieced tubular one 32' as shown in FIG. 3B. In such a case, a gap CL is formed between the inner circumference of the mesh-cloth member 32' having a uniform thickness and the outer circumference of the protective layer 38 and the insulative substrate 34. The thickness of the mesh-cloth member 32' is, for example, in a range from 0.3 to 1 mm.

Since the through-holes as used in the conventional flexible printed circuit board are unnecessary by using the mesh-cloth member 32 or 32', it is possible to simplify the production process to lower the production cost.

Figure 8:
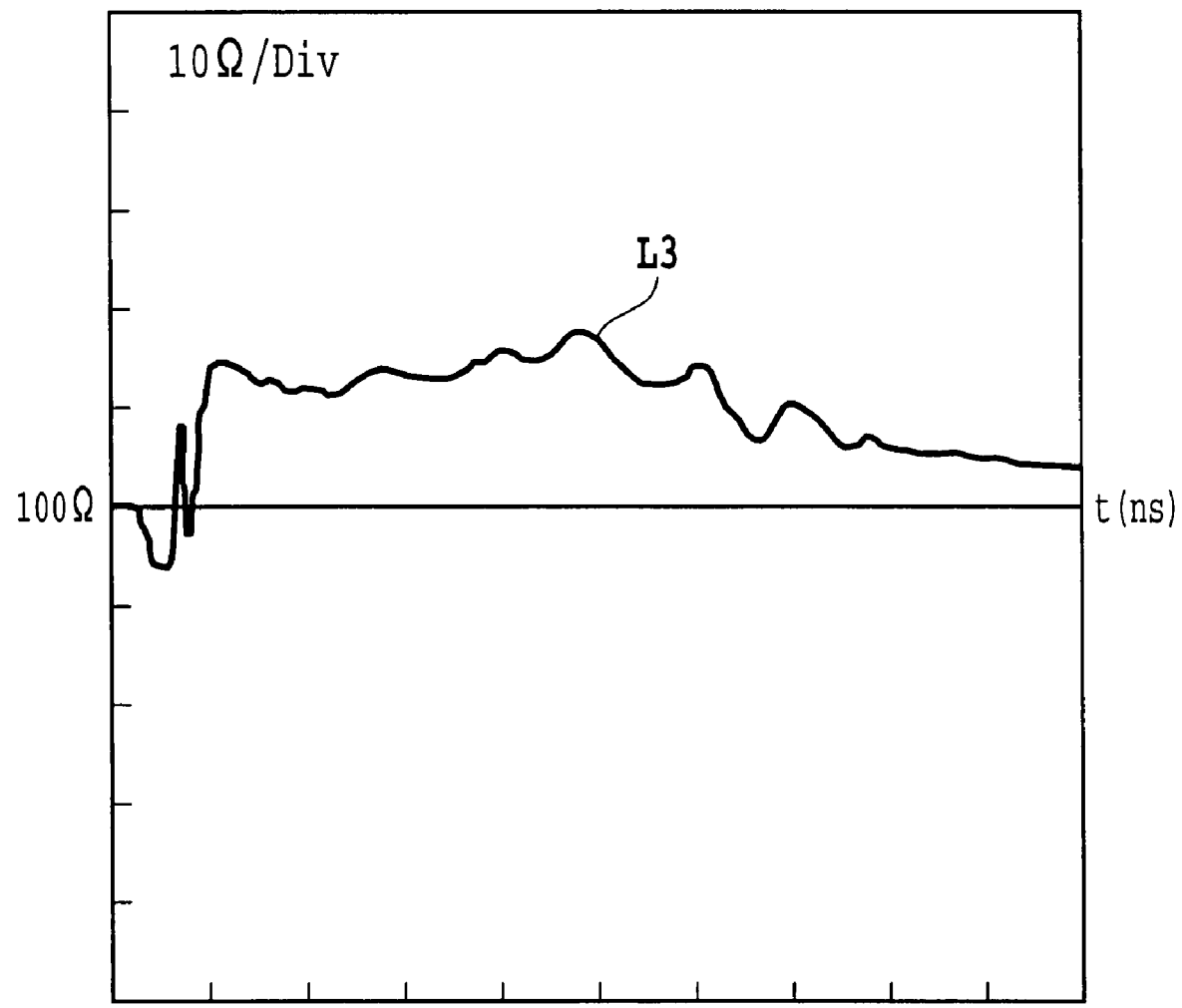
FIG. 8 is a characteristic diagram showing a measured result of the characteristic impedance in the first embodiment of a flexible printed circle according to the present invention.

FIG. 8 shows results of the measurement of characteristic impedance of the flexible printed circuit board 30 in the first embodiment carried out by the inventor of the present invention for inspecting the effect of the mesh-cloth member 32 when a predetermined metallic piece is disposed near to the flexible printed circuit board 30 of the first embodiment shown in FIG. 1.

In this case, a thickness of the mesh-cloth member 32 of the tested flexible printed circuit board 30 is set to 0.5 mm.

Figure 5:
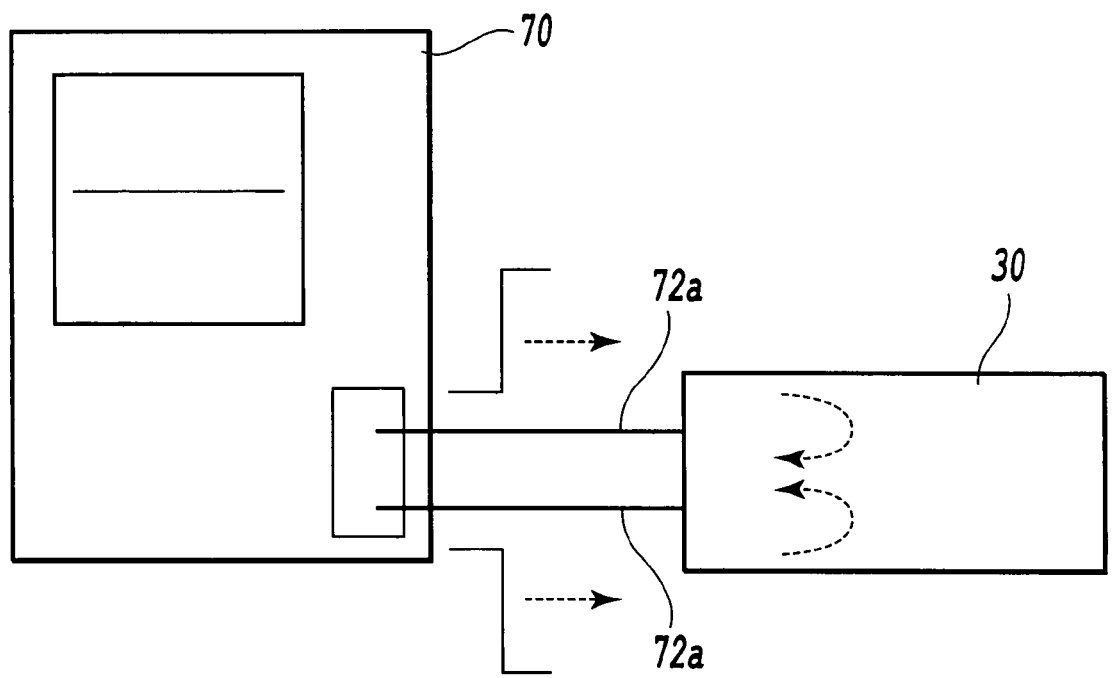
FIG. 5 is a diagram schematically illustrating a measuring instrument for measuring a characteristic impedance of an object to be measured in the embodiment of a flexible printed circuit board according to the present invention.

A TDR (Time Domain Reflectometry) method was used for measuring the characteristic impedance. The TDR method is carried out by a measuring device 70 shown in FIG. 5. In FIG. 5, the measuring device 70 for measuring the characteristic impedance is, for example, a digitizing oscilloscope (made by TECHTRONICS: 11803B+SD24). The digitizing oscilloscope includes a generator delivering step pulses as test signals to the tested object and a sampler detecting reflected wave shapes from the tested object.

The flexible printed circuit board 30 is connected, as an object to be measured, to an input/output section of the measuring device 70 via connecting cables 72a. In this state, a rear end of the flexible printed circuit board 30 is open. Also, the flexible printed circuit board 30 is disposed on a band-shaped copper film while bringing the board into intimate contact with the film.

The relationship represented by the following equations (1), (2) exists between the characteristic impedance Zr(O) and the reflectance ρ:

$$Zr = Zo\,(1+\rho)/(1-\rho)(O) \quad (1)$$

$$\rho = \text{reflected voltage/incident voltage} = (Zr-Zo)/(Zr+Zo) \quad (2)$$

wherein Zo represents a known characteristic impedance (O) used as a reference value.

Accordingly, if the reflectance p is obtained by the above-mentioned measuring device 70, the characteristic impedance Zr of the measured object is calculated by the equation (1). Note, as shown in FIGS. 6 to 8, data representing the characteristic curve of the characteristic impedance Zr are also obtained from the output section of the measuring device 70.

FIG. 8 illustrates a characteristic curve L3 of the characteristic impedance of the flexible printed circuit board 30, represented on a graph wherein a vertical axis indicates the impedance (Ω) and a horizontal axis indicates the time t(ns).

Figure 6:
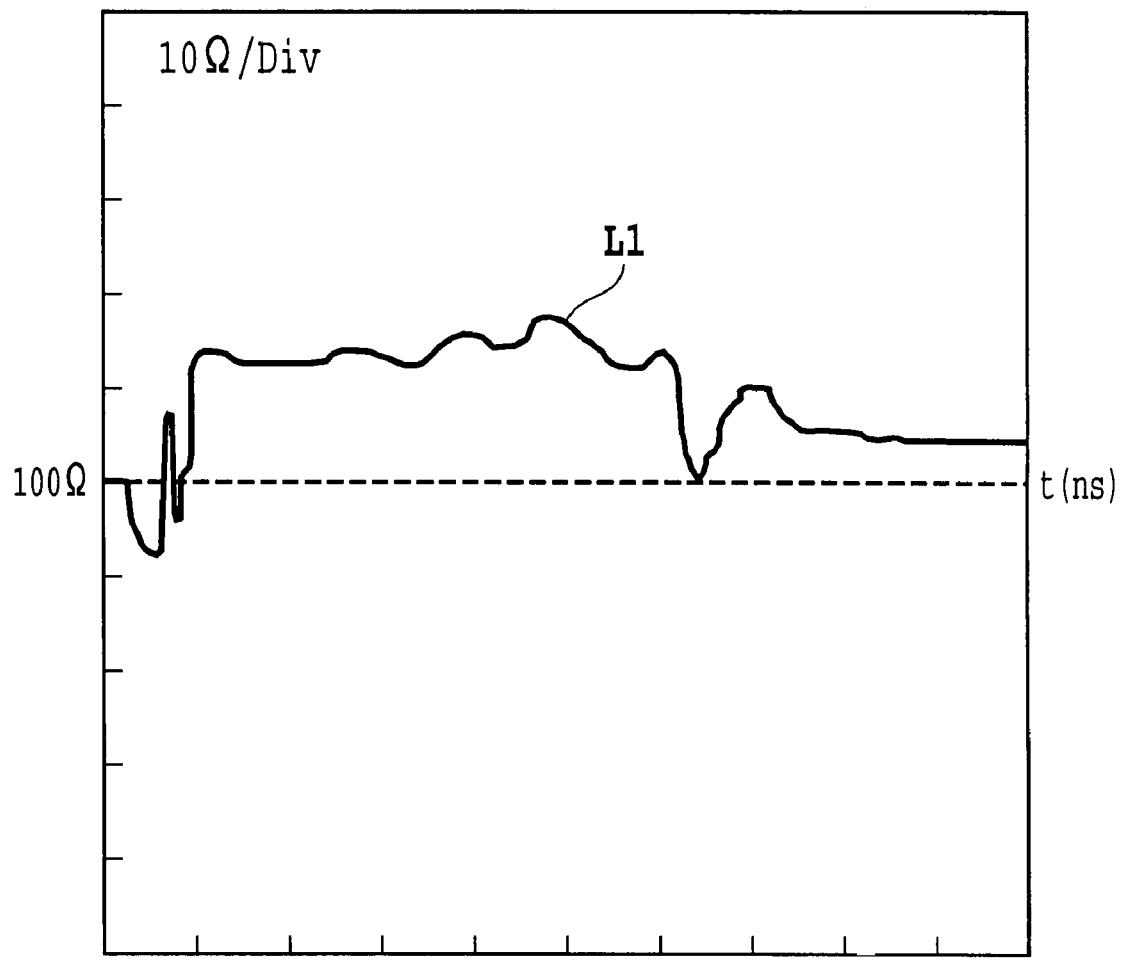
FIG. 6 is a characteristic diagram showing a measured result of the characteristic impedance in comparative example A.

On the other hand, FIG. 6 illustrates a characteristic curve L1 of the characteristic impedance of a flexible printed circuit board having no mesh-cloth member 32, as a comparative example A, represented on a graph wherein a vertical axis indicates the impedance (Ω) and a horizontal axis indicates the time t(ns). The insulative substrate or others forming the flexible printed circuit board is the same as that of the flexible printed circuit board 30. Note the measured results shown in FIG. 6 were obtained by connecting the flexible printed circuit board having no mesh-cloth member 32 to the measuring device 70, while being directly placed on the predetermined test table without the intervention of the band-shaped copper film.

Figure 7:
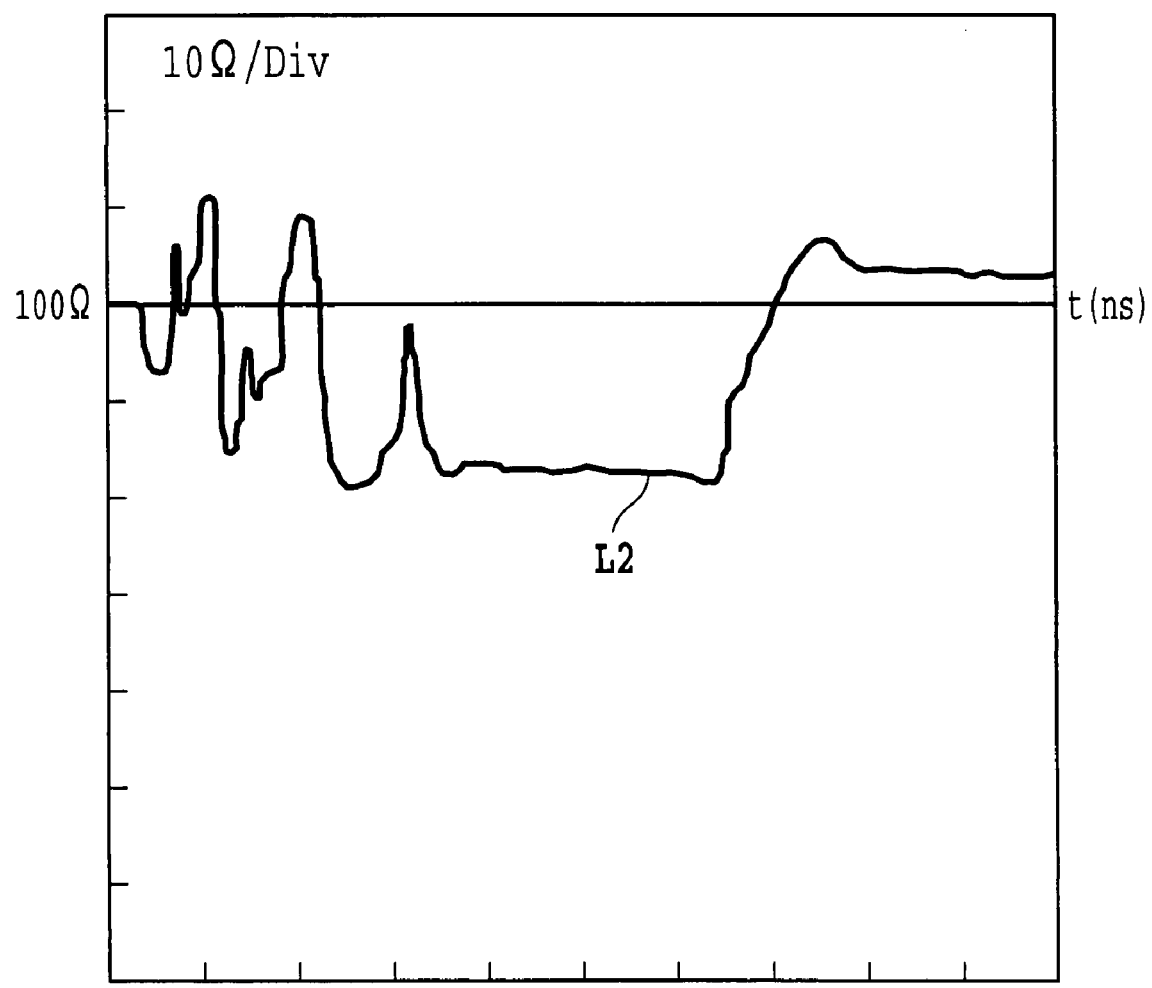
FIG. 7 is a characteristic diagram showing a measured result of the characteristic impedance in comparative example B.

Also, FIG. 7 is a characteristic curve L2 of the characteristic impedance of a flexible printed circuit board having no mesh-cloth member 32, as a comparative example B, represented on a graph wherein a vertical axis indicates the impedance (Ω) and a horizontal axis indicates the time t(ns). The insulative substrate or others forming the flexible printed circuit board is the same as that of the flexible printed circuit board 30. Note the measured results shown in FIG. 7 were obtained by connecting the flexible printed circuit board having no mesh-cloth member 32 to the measuring device 70, while being placed on the predetermined test table in a state wherein the above-mentioned band-shaped copper film is in close contact the flexible printed circuit board.

According to these measured results, as apparent from the characteristic curve L1 shown in FIG. 6 and that L2 shown in FIG. 7, it was confirmed that the characteristic impedance of the flexible printed circuit board having no mesh-cloth member 32 is approximately 112(O), while when the flexible printed circuit board is in close contact with the band-like copper film, the characteristic impedance becomes approximately 80(O) whereby the transmission characteristic solely in such a part was disturbed to result in the increase in loss.

Also, as apparent from the characteristic curve L1 shown in FIG. 6 and that L2 shown in FIG. 8, since the characteristic impedance of the flexible printed circuit board having no mesh-cloth member 32 is approximately 112(O) and that of the flexible printed circuit board 30 is also approximately 112(O), it was confirmed that the characteristic impedance hardly changes, because the mesh-cloth member 32 prevents the characteristic impedance from being affected by the band-like copper film.

Accordingly, as described later, the same effect is obtainable for avoiding the same electrical interference as in a case wherein a ground surface is provided opposite to a surface of the flexible printed circuit board on which the signal lines are formed, since it is possible reduce the electrical interference by −30 dB (=10 log 1/1000) or more.

Figure 11A:
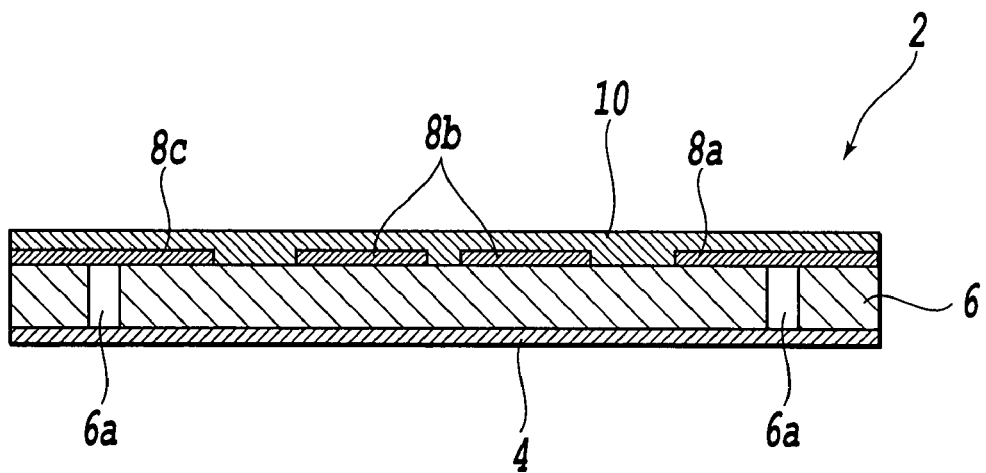
FIGS. 11A and 11B are partial cross-sectional views illustrating a structure of prior art flexible printed circuit boards, respectively.
Figure 11B:
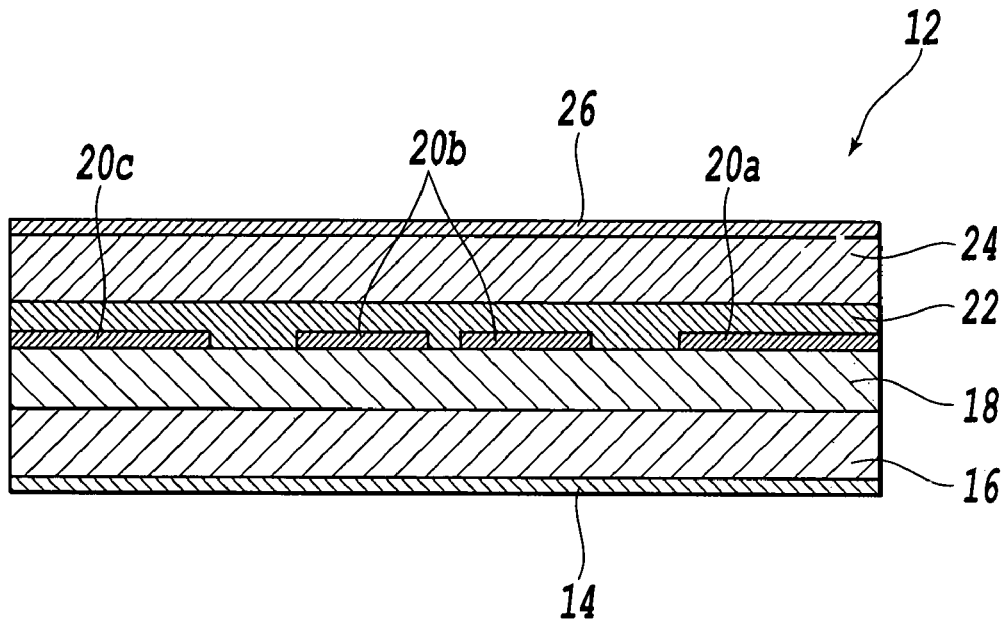

It was confirmed by the inventor of the present invention that when the differential impedance of the conventional flexible printed circuit board, for example, shown in FIG. 11A is 100(O), a width of a signal line thereof is set to approximately 100 μm, and the transmission loss of signals in a frequency band of 5 GHz is approximately 13 dB/m, while the signal transmission loss of the flexible printed circuit board 30 is approximately 8 dB/m in a frequency band of 5 GHz. That is, the transmission loss is reduced by approximately 5 dB/m.

Further, since the flexible printed circuit board 30 has no ground layer as in the conventional flexible printed circuit board, the degree of design freedom is improved. Accordingly, a width or others of a signal path forming a signal line is freely set. In addition, by properly selecting the width of the signal path and the interval the adjacent ones, the transmission loss is reduced. Also, since the mesh-cloth member 32 is assumed as the mixture of air and dielectric, the effective relative dielectric constant thereof becomes lower in comparison with the dielectric only, whereby the dielectric loss is also limited to a lower level and the transmission loss is not increased.

Figure 10:
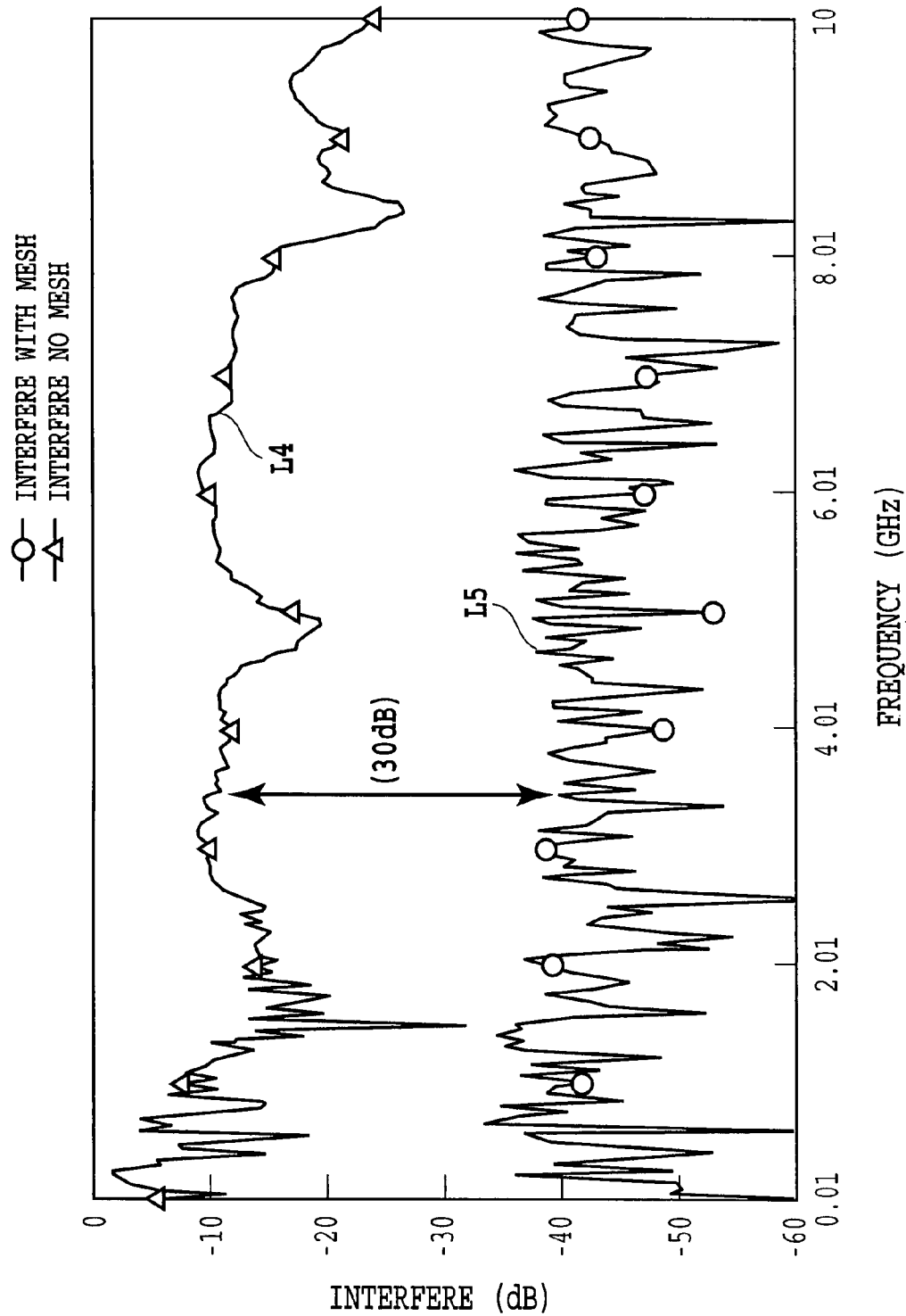
FIG. 10 is characteristic diagram representing a characteristics regarding an amount of the mutual interferences in the first embodiment and a comparative example C.

FIG. 10 shows graphs representing results of the measurement of the mutual interference when the two flexible printed circuit boards according to the inventor of the present invention are in tight contact with each other.

FIG. 10 is a characteristic curve L5 representing the variation of the mutual interference in accordance with the frequencies of the differential signal when the two flexible printed circuit boards 30 are in close contact with each other, and a characteristic curve L4 representing the variation of the mutual interference in accordance with the frequencies of the mutual interference in Comparative example C, on a graph wherein a vertical axis indicates the mutual interference (leakage power/transmission power) (dB) and a horizontal axis indicates the frequency (GHz).

The characteristic curves L4 and L5 shown in FIG. 10 are obtained by a vector network analyzer (hereinafter referred to as a network analyzer made by AZIRENT TECHNOLOGY (phonetic) Co.: N5230A opt240) wherein the measurement results individually obtained on two objects to be measured are represented on the same graph system. The network analyzer includes a signal line delivering the differential signal which frequency is variable, four output connectors connected to the object to be measured, and a directional coupling disposed between a signal source and the output connectors. The object to be measured is connected between the output connectors.

Figure 9:
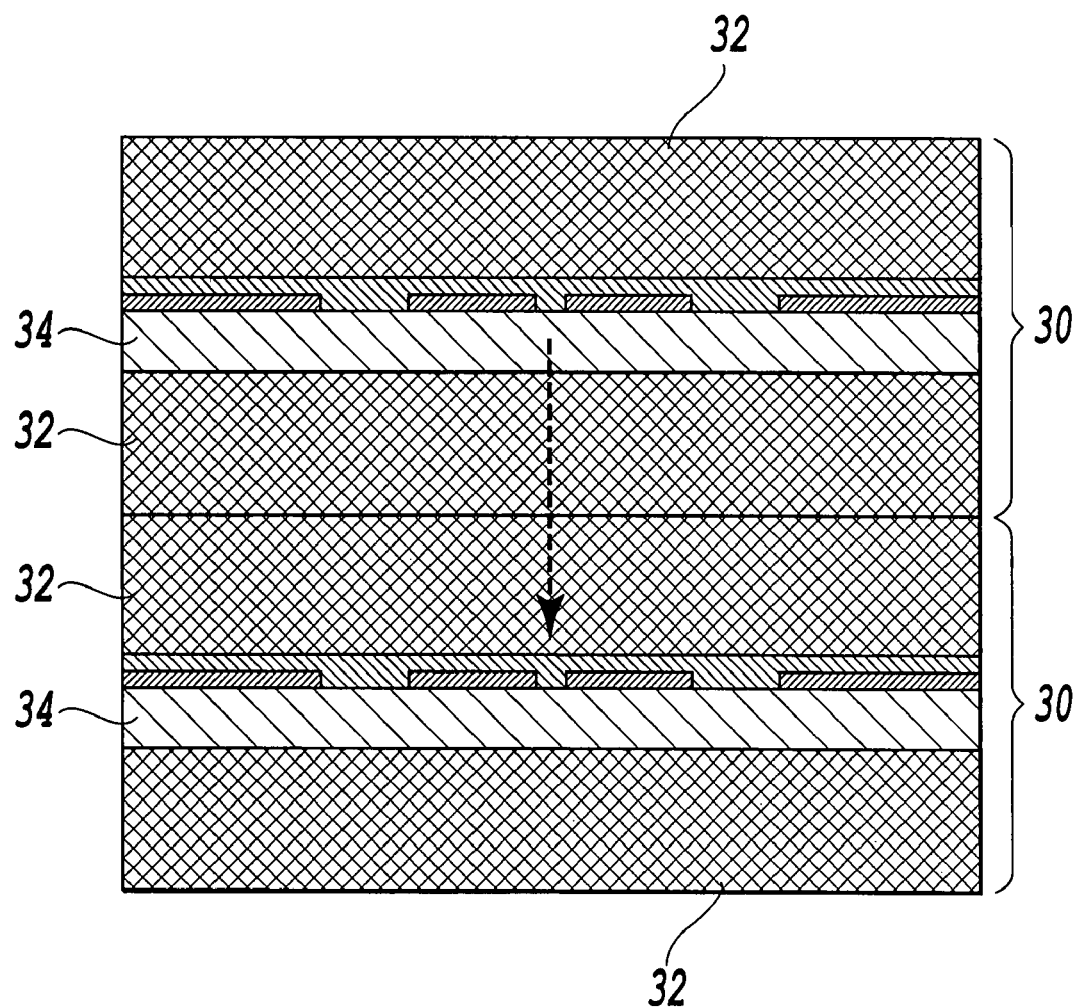
FIG. 9 is a partial cross-sectional view of an object which an amount of a mutual interference is to be measured in the first embodiment of the flexible printed circuit board according to the present invention.

As shown in FIG. 9, two flexible printed circuit boards 30 of 1100 mm long are prepared as the object to be measured, and held so that flat surfaces of the mesh-cloth members 32 are brought into tight contact with each other. Note the mesh-cloth member 32 has a thickness of 475 μm, a porosity of 52%, a diameter of nylon yarn of 275 μm and a yarn gap of 670 μm.

In Comparative example C, two flexible printed circuit boards having no mesh-cloth member 32 are prepared as the object to be measured. The insulative substrate or others of the flexible printed circuit board is the same as in the flexible printed circuit board 30. The two flexible printed circuit boards are held so that flat surfaces of the insulative substrates 34 in tight contact with each other.

As apparent from the characteristic curves L4 and L5 in FIG. 10, it was confirmed by the inventor of the present invention that when the mesh-cloth members 32 exist, the electrical interference is reduced by approximately 30 dB in comparison with a case having no mesh-cloth members 32.

FIG. 3A illustrates a main part of a second embodiment of a flexible printed circuit board according to the present invention.

A flexible printed circuit board 40 shown in FIG. 3A has metallic covering layers 42A and 42B of a predetermined thickness on the outer circumference of the mesh-cloth members 32 of the flexible printed circuit board 30 shown in FIG. 1, in addition thereto.

In FIG. 3A, the same reference numerals are used for designating the same constituent elements as in FIG. 1, and the explanation thereof will be eliminated.

The metallic covering layers 42A and 42B are formed of a copper tape having adhesive on one surface of copper foil of 10 μm thick or an aluminum tape having adhesive on one surface of aluminum foil of 10 μm thick, while taking a skin effect into consideration.

Ends of the covering layers 42A and 42B in the extending direction of the ground conductive layers 36a and 36c are respectively connected to ends of the latter not shown. In this regard, it is confirmed by the inventor of the present invention that even if the covering layers 42A and 42B are formed, the characteristic impedance does not vary, whereby the transmission loss is also hardly changed. Accordingly, unnecessary radiation generated from the flexible printed circuit board 40 is reduced.

Note this example should not be limitative, and a conductive cloth may be used instead of the metallic covering layers 42A and 42B. In such a case, it is possible to improve the flexibility in comparison with the metallic covering layers.

Further, in place of the metallic covering layers 42A and 42B, a radio wave-absorbing sheet may be used. In such a case, it is unnecessary to connect ends of the radio wave-absorbing sheet in the extending direction of the ground conductive layers 36a and 36c to ends of the ground conductive layers 36a and 36c.

Figure 4:
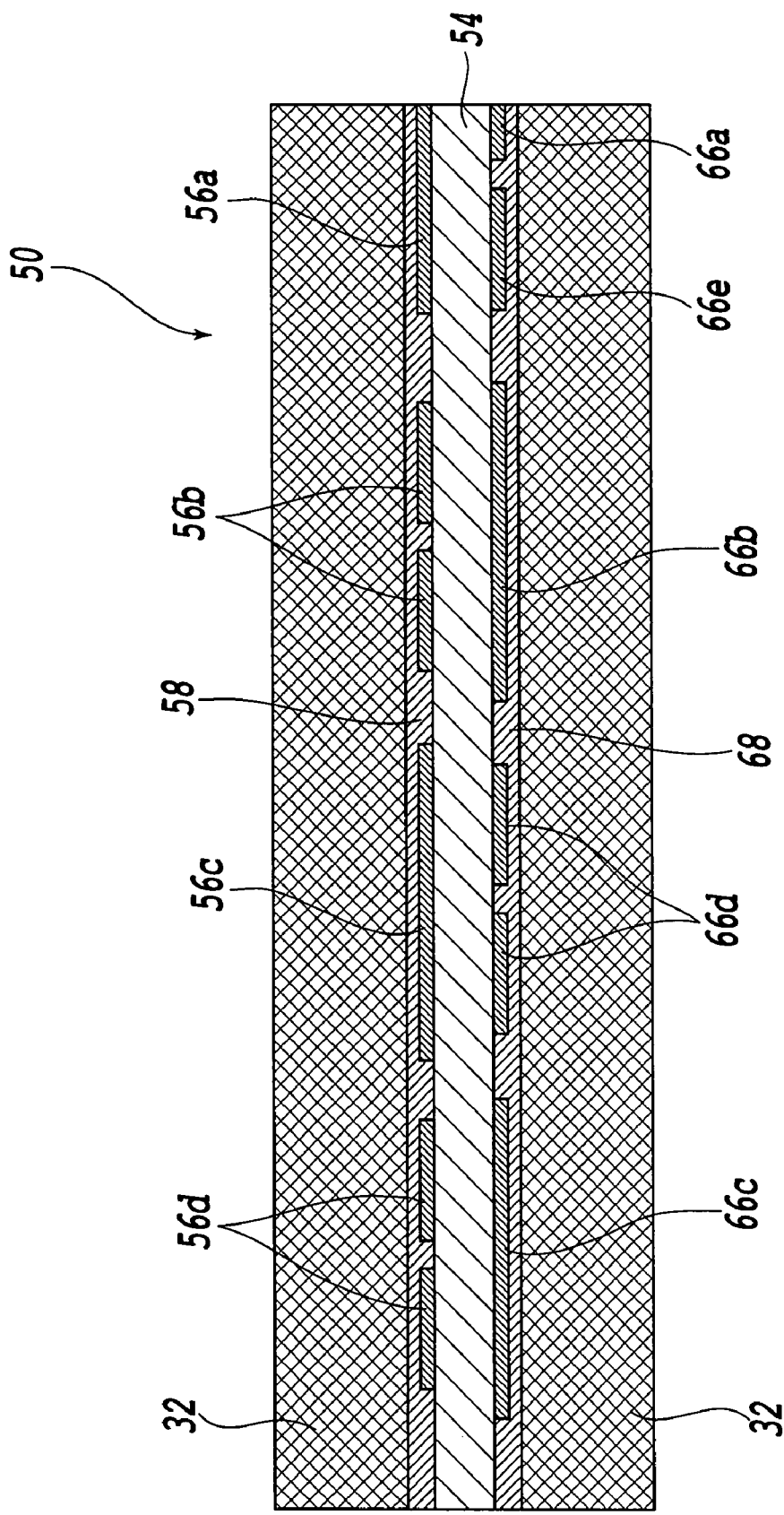
FIG. 4 is a partial cross-sectional view of a main part of a third embodiment of a flexible printed circuit board according to the present invention.

FIG. 4 illustrates a main part of a third embodiment of a flexible printed circuit board according to the present invention.

In FIG. 4, the same reference numerals are used for designating the same constituent elements as in FIG. 1, and the explanation thereof will be eliminated.

While a plurality of conductive layers 36b are formed solely on one surface of the insulative substrate 34 in the example shown in FIG. 1, a plurality of conductive layers 56b and 66b are formed on both of opposite surfaces of the insulative substrate 54, respectively, in the example shown in FIG. 4.

In FIG. 4, a flexible printed circuit board 50 includes an insulative substrate 54 having a plurality of conductive layers on the opposite surfaces thereof, and the mesh-cloth member 32 as a reticulate covering member for covering protective layers 58 and 68 and the insulative substrate 54 as a whole.

On one surface of the insulative substrate 54, a plurality of conductive layers 56a, 56b, 56c and 56d covered with a protective layer 58 are formed. On the other surface of the insulative substrate 54, a plurality of conductive layers 66a, 66b, 66c, 66d and 66e covered with a protective layer 58 are formed.

The insulative substrate 54 is molded with glass-epoxy resin, for example, to have a thickness of approximately 50 μm. Also, the plurality of conductive layers 56a, 56b, 56c, 56d, 66a, 66b, 66c, 66d and 66e are formed of copper alloy by a known pattern-forming technique. A pair of the conductive layers 56b and 56d form signal lines extending generally parallel to each other and vertical to a paper surface. The conductive layers 56a and 56c for the ground line are formed adjacent to the opposite sides of the respective conductive layer 56b at a predetermined interval for the purpose of reducing the crosstalk in the signal lines. A pair of the conductive layers 66d form signal lines extending generally parallel to each other and vertical to a paper surface. The conductive layers 66b and 66c for the ground line are formed adjacent to the opposite sides of the respective conductive layer 66d at a predetermined interval for the purpose of reducing the crosstalk in the signal lines.

To the conductive layers 56b, 56d and 66d, differential signals at a communication speed approximately in a range from 2.5 to 10 Gbps are fed. The protective layers 58 and 68 are formed of heat-curable resist, polyimide film or others.

Also in this example, the mesh-cloth member 32 is structured, for example, by arranging two mesh-cloth pieces having a predetermined length opposite to each other while interposing the protective layer 58 and 68 and the insulative substrate 54 between them, and heat sealing lapped ends thereof extending along the signal lines.

In this regard, while the mesh-cloth member 32 is formed by heat sealing the lapped ends thereof, this is not limitative, but the mesh-cloth member may be a one-pieced tubular one 32' as shown in FIG. 3B.

Since the flexible printed circuit board 50 has the mesh-cloth member 32 also in this structure, the same effect as in the above-mentioned first embodiment is obtainable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A flexible printed circuit board comprising:
   an insulative substrate having a plurality of ground conductive layers and a signal-transmission conductive layer formed between said ground conductive layers; and
   a reticulate covering member formed of a dielectric having voids for covering said insulative substrate wherein said reticulate covering member is a tube formed to have a predetermined gap from said insulative substrate; and
   wherein said insulative substrate is disposed inside of said tube.

2. The flexible printed circuit board as claimed in claim 1, wherein said reticulate covering member is formed of a dielectric having a relative dielectric constant in a range from 2 to 4.

3. The flexible printed circuit board as claimed in claim 1, wherein a thickness and a porosity of said reticulate covering member are from 0.3 mm to 1 mm and 50% or more, respectively.

4. A flexible printed circuit board comprising:
   an insulative substrate having a plurality of ground conductive layers and a signal-transmission conductive layer formed between said ground conductive layers; and
   a reticulate covering member formed of a dielectric having voids for covering said insulative substrate, and having a conductive layer on the outer circumference thereof, said conductive covering layer being electrically connected to an end of said ground conductive layer,
   wherein said reticulate covering member is a tube formed to have a predetermined gap from said insulative substrate; and
   wherein said insulative substrate is disposed inside of said tube.

5. The flexible printed circuit board as claimed in claim 4, wherein said conductive covering layer is a metallic film or a conductive cloth.

6. The flexible printed circuit board as claimed in claim 4, wherein said conductive covering layer is a radio wave absorber.

* * * * *